United States Patent
Yun et al.

(10) Patent No.: US 9,046,779 B2
(45) Date of Patent: Jun. 2, 2015

(54) METHOD OF FABRICATING DISPLAY DEVICE USING MASKLESS EXPOSURE APPARATUS AND DISPLAY DEVICE

(71) Applicant: SAMSUNG DISPLAY CO., LTD., Yongin, Gyeonggi-Do (KR)

(72) Inventors: Sang Hyun Yun, Suwon-si (KR); Cha-Dong Kim, Seoul (KR); Jung-In Park, Seoul (KR); Jae Hyuk Chang, Seongnam-si (KR); Hi Kuk Lee, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 107 days.

(21) Appl. No.: 13/861,039

(22) Filed: Apr. 11, 2013

(65) Prior Publication Data

US 2014/0186595 A1 Jul. 3, 2014

(30) Foreign Application Priority Data

Dec. 27, 2012 (KR) ........................ 10-2012-0155109

(51) Int. Cl.
*B32B 3/00* (2006.01)
*G03F 7/20* (2006.01)
(Continued)

(52) U.S. Cl.
CPC ............ *G03F 7/2022* (2013.01); *G03F 7/0007* (2013.01); *Y10T 428/24851* (2015.01); *G02F 1/13394* (2013.01); *G02F 1/133512* (2013.01)

(58) Field of Classification Search
CPC ................... G02F 1/133512; G02F 1/126209; G02F 1/13394
See application file for complete search history.

(56) References Cited

U.S. PATENT DOCUMENTS 6,238,852 B1 5/2001 Klosner
6,285,488 B1 9/2001 Sandstrom
(Continued)

FOREIGN PATENT DOCUMENTS

JP   2005-165013    6/2005
JP   2009-245743   10/2009
KR   10-0615439    8/2006

OTHER PUBLICATIONS

English Abstract for Publication No. 2009-245743.
(Continued)

*Primary Examiner* — Elizabeth Mulvaney
(74) *Attorney, Agent, or Firm* — F. Chau & Associates, LLC

(57) ABSTRACT

The present invention relates to a method of fabricating a display device using a maskless exposure apparatus, and the display device, and more particularly, to a method of fabricating a display device by using a maskless exposure apparatus, which is capable of preventing a stain from being viewed, and the display device. An exemplary embodiment of the present invention provides a method of fabricating a display device, including: forming a first exposure region on a substrate by performing exposure while scanning the substrate with a first exposure head irradiating an exposure beam according to pattern information of a first pattern in a scanning direction; and forming a second exposure region adjacent to the first exposure region on the substrate by performing exposure while scanning the substrate with a second exposure head irradiating an exposure beam according to the pattern information of the first pattern in the scanning direction; in which an exposure boundary region between the first exposure region and the second exposure region is extended in the scanning direction, and the exposure boundary region overlaps a light blocking region.

20 Claims, 15 Drawing Sheets

(51) Int. Cl.
  *G03F 7/00* (2006.01)
  *G02F 1/1335* (2006.01)
  *G02F 1/1339* (2006.01)

(56) References Cited

U.S. PATENT DOCUMENTS

| | | | |
|---|---|---|---|
| 6,312,134 B1 | 11/2001 | Jain et al. | |
| 6,428,940 B1 | 8/2002 | Sandstrom | |
| 6,811,953 B2 | 11/2004 | Hatada et al. | |
| 6,876,440 B1 | 4/2005 | Bleeker et al. | |
| 7,023,526 B2 | 4/2006 | Latypov et al. | |
| 7,027,120 B2 | 4/2006 | Yoo et al. | |
| 7,352,431 B2 | 4/2008 | Tak | |
| 8,072,580 B2 | 12/2011 | Cha et al. | |
| 2005/0110940 A1 | 5/2005 | Lee et al. | |
| 2008/0231765 A1 | 9/2008 | Horiguchi | |
| 2010/0208229 A1 | 8/2010 | Shin et al. | |
| 2011/0230019 A1* | 9/2011 | Yun et al. | 438/158 |
| 2011/0267594 A1* | 11/2011 | Kim et al. | 355/67 |
| 2012/0038864 A1 | 2/2012 | Matsui et al. | |
| 2012/0188477 A1* | 7/2012 | Jung et al. | 349/42 |
| 2012/0236236 A1* | 9/2012 | Sung et al. | 349/106 |
| 2012/0241740 A1* | 9/2012 | Park et al. | 257/49 |

OTHER PUBLICATIONS

English Abstract for Publication No. 2005-165013.
English Abstract for Publication No. 10-0615439.

* cited by examiner

METHOD OF FABRICATING DISPLAY DEVICE USING MASKLESS EXPOSURE APPARATUS AND DISPLAY DEVICE

CROSS-REFERENCE TO RELATED APPLICATION

This U.S. non-provisional application claims priority under 35 U.S.C. §119 to Korean Patent Application No. 10-2012-0155109 filed in the Korean Intellectual Property Office on Dec. 27, 2012, the disclosure of which is incorporated by reference herein in its entirety.

TECHNICAL FIELD

Exemplary embodiments of the present invention relates to a method of fabricating a display device, and more particularly, to a display device and a method of fabricating the display device using a maskless exposure apparatus.

DISCUSSION OF THE RELATED ART

As an alternative to photolithography, maskless exposing may be performed by a maskless exposure apparatus to form various patterns when fabricating displays. An example of the maskless exposure apparatus is a digital exposure apparatus. The digital exposure apparatus transfers digital pattern information onto a substrate in synchronization with the movement of the substrate by using a light modulator without a photomask. An example of the light modulator includes a digital micro-mirror device (DMD). The DMD includes a plurality of micro-mirrors. Each micro-mirror reflects an exposure beam to a region corresponding to the pattern information by directing a part of light incident according to the pattern information at a predetermined angle and by directing another part of the light at a different angle.

The maskless exposure apparatus may include a plurality of exposure heads including light modulators, respectively. An exposure beam may be scanned on the substrate while moving the substrate with respect to the exposure heads. Exposure scanning may be performed on a substrate several times. Since the size, position, and intensity of an exposure beam are not uniform, a pattern formed in a region in which exposure regions overlap or a pattern formed at the boundary between exposure regions adjacent to each other may be different in quality from a pattern formed in a region in which the exposure regions do not overlap each other. A difference in the quality between the patterns may be recognized as a stain when viewed from the outside.

SUMMARY

An exemplary embodiment of the present invention provides a method of fabricating a display device. The method includes forming a first exposure region on a substrate by performing exposure while scanning the substrate with a first exposure head irradiating an exposure beam according to pattern information of a first pattern in a scanning direction. A second exposure region adjacent to the first exposure region is formed on the substrate by performing exposure while scanning the substrate with a second exposure head irradiating an exposure beam according to the pattern information of the first pattern in the scanning direction. An exposure boundary region between the first exposure region and the second exposure region is extended in the scanning direction. The exposure boundary region overlaps a light blocking region.

The first exposure head and the second exposure head may scan the substrate substantially at the same time.

The first exposure head and the second exposure head may scan the substrate at different times from each other.

The first exposure region and the second exposure region, respectively, may belong to different scanning exposure regions from each other.

An edge boundary of the first exposure region and an edge boundary of the second exposure region may be substantially aligned with substantially the same line included in the exposure boundary region.

The first exposure region and the second exposure region may be spaced apart from each other and may form a spaced region included in the exposure boundary region.

The first exposure region and the second exposure region may overlap each other and may form an overlapping region included in the exposure boundary region.

At least one of the first exposure head or the second exposure head may include a digital micro-mirror device (DMD) unit reflecting light from a light unit to the substrate. The DMD unit may include a DMD selectively reflecting the light.

The DMD may include a plurality of micro-mirrors respectively adjusting inclined angles.

A width of the light blocking region may be equal to or larger than a width of the exposure boundary region.

The light blocking region may include a light blocking member.

An exemplary embodiment of the present invention provides a display device. The display device includes a first pattern. The first pattern includes a first portion and a second portion respectively positioned in a first region and a second region divided with respect to a boundary line extended in a first direction. The first pattern includes a non-uniform pattern region formed along the boundary line. A light blocking region overlaps the non-uniform pattern region. A pattern quality of the non-uniform pattern region is different from a pattern quality of at least one of the first portion and the second portion.

A width of the first portion may be different from a width of the second portion.

The non-uniform pattern region may include a notch having a width different from at least one of a width of the first portion or a width of the second portion.

The first portion and the second portion may be misaligned with each other with respect to the boundary line.

The display device may further include a second pattern. The second pattern includes a portion extending in a direction substantially perpendicular to the first direction. The display device may further include a third pattern. The third pattern includes a portion extending in a direction substantially parallel to the first direction. The portion of the second pattern extending in the direction substantially perpendicular to the first direction is rougher than the portion of the third pattern extending in the direction substantially parallel to the first direction.

A width of the light blocking region may be equal to or larger than a width of the non-uniform pattern region.

The light blocking region may include a light blocking member.

According to an exemplary embodiment of the present invention, there is provided a method of fabricating a display device. In the method, a first pattern is formed on a first region of a substrate by performing an exposure process on the first region of the substrate by using a first exposure head. A second pattern is formed on a second region of the substrate by performing the exposure process on the second region of the substrate by using a second exposure head. A light blocking region is formed on a boundary region between the first and second regions of the substrate.

The boundary region is not recognized when viewed from an outside.

DETAILED DESCRIPTION OF EXEMPLARY EMBODIMENTS

Figure 1:
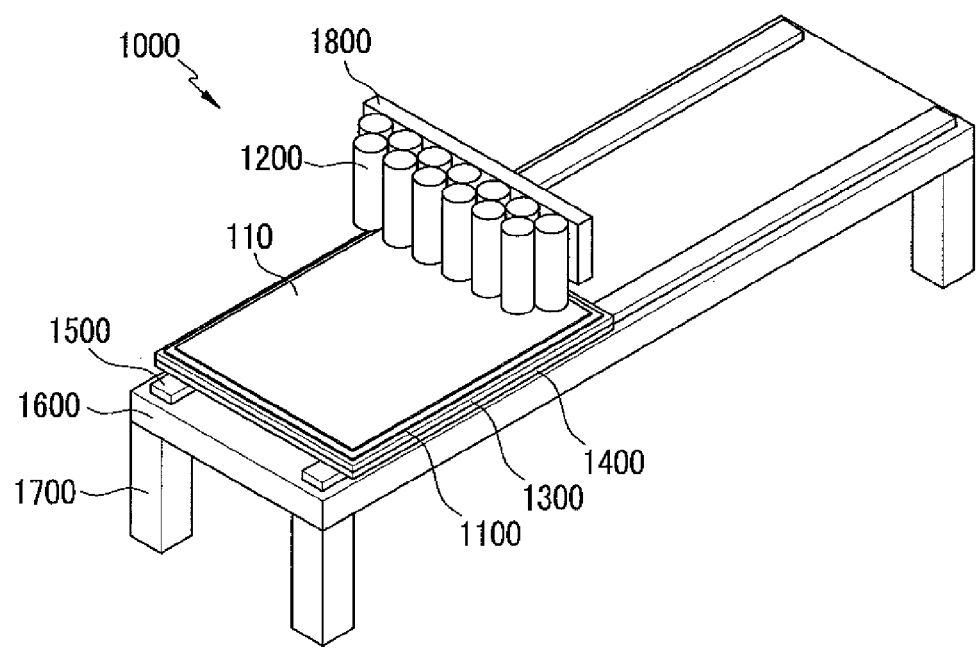
FIG. 1 is a perspective view illustrating a maskless exposure apparatus according to an exemplary embodiment of the present invention.

Exemplary embodiments of the present invention will be described in more detail hereinafter with reference to the accompanying drawings. As those skilled in the art would realize, the described embodiments may be modified in various different ways Like reference numerals may designate like or similar elements throughout the specification and the drawings. It will be understood that when an element is referred to as being "on," "connected to," or "coupled to" another element, it can be directly on, connected to or coupled to the other element or intervening elements may be present.

As used herein, the singular forms "a," "an," and "the" are intended to include the plural forms as well, unless the context clearly indicates otherwise.

Figure 2:
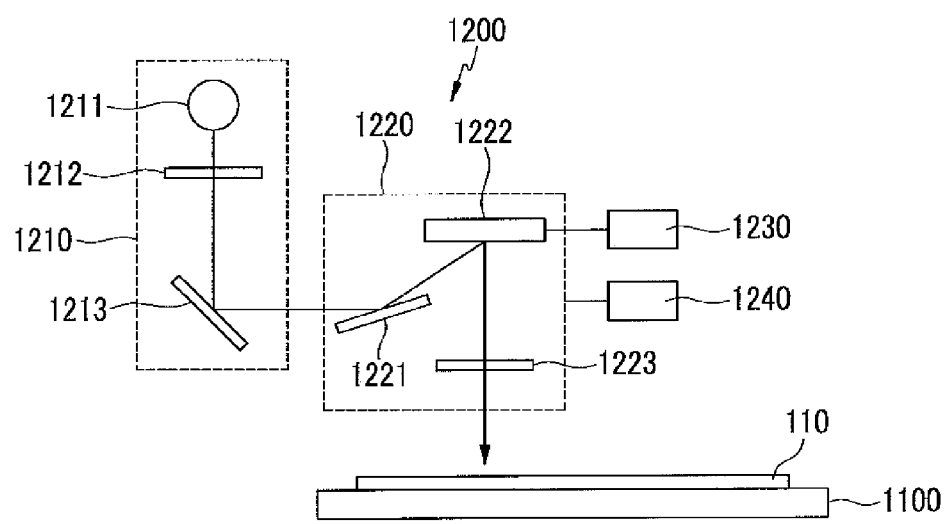
FIG. 2 is a cross-sectional view illustrating an optical system of a maskless exposure apparatus according to an exemplary embodiment of the present invention.
Figure 3:
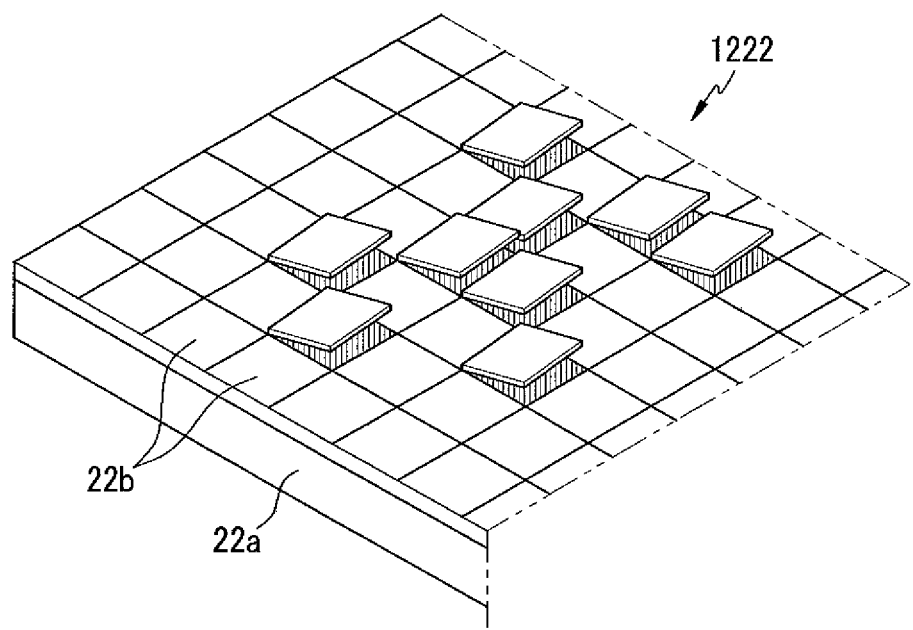
FIG. 3 is a perspective view illustrating a configuration of a DMD of a maskless exposure apparatus according to an exemplary embodiment of the present invention.

FIG. 1 is a perspective view illustrating a maskless exposure apparatus according to an exemplary embodiment of the present invention, FIG. 2 is a cross-sectional view illustrating an optical system of a maskless exposure apparatus according to an exemplary embodiment of the present invention, and FIG. 3 is a perspective view illustrating a configuration of a micro mirror device (DMD) of a maskless exposure apparatus according to an exemplary embodiment of the present invention.

Referring to FIG. 1, the maskless exposure apparatus 1000 according to an exemplary embodiment of the present invention includes a stage 1100 and one or more exposure heads 1200.

A substrate 110, which is subject to exposure, is mounted on the stage 1100. The stage 1100 supports the substrate 110. The stage 1100 may be positioned on a base 1600 shaped like a flat plate. The base 1600 may be supported by, for example, four base support units 1700.

A photosensitive film, which is subject to exposure, may be applied on the substrate 110.

At least two driving guides 1500 extend in a movement direction of the stage 1100. The movement direction of the stage may be referred to as a "Y-direction," and the driving guides 1500 may be also referred to as "Y-directional driving guides 1500." The Y-directional driving guides 1500 may be positioned between the base 1600 and the stage 1100. A Y-directional driving stage 1400 may be installed on the Y-directional driving guides 1500. The Y-directional driving stage moves along the Y-directional driving guides 1500. A θ-directional driving stage 1300 may be installed on the Y-directional driving guides 1500. When the substrate 110 is mounted in a misaligned position, the θ-directional driving stage 1300 rotates the substrate 110 with respect to a plane of the base 1600 and corrects the misaligned position of the substrate 110. The stage 1100 may be positioned on the θ-directional driving stage 1300.

The exposure heads 1200 are positioned above the base 1600. The exposure heads 1200 selectively irradiate light to the substrate 110 mounted on the stage 1100. The exposure heads 1200 may be fixed to an exposure head fixing block 1800. Two opposite sides of the exposure head fixing block 1800 may be respectively fixed to two opposite sides of the base 1600. When the exposure apparatus 1000 includes a plurality of exposure heads 1200, the plurality of exposure heads 1200 may be arranged in two or more columns that are misaligned to each other and may scan and expose to light an entire surface of the substrate 110. However, the number of columns of the exposure heads 1200 and methods of arranging the exposure heads 1200 are not limited thereto.

Referring to FIG. 2, an exposure head 1200 according to an exemplary embodiment of the present invention includes a light unit 1210 for generating light for exposure and a micro mirror device (DMD) unit 1220 for receiving light from the light unit 1210 and irradiating the light onto the substrate 110.

The light unit 1210 includes a light source 1211 for generating light. An example of the light source 1211 may be a laser diode. Light emitted from the light source 1211 may pass through a lens, such as a fly-eye lens 1212, and may be evenly distributed. A rod lens or a hollow lens may be used instead of the fly-eye lens 1212.

Light passing through the flay-eye lens 1212 is reflected by a guide mirror 1213, and thus, the path thereof may be changed. Light reflected by the guide mirror 1213 may be transmitted to the DMD unit 1220.

The DMD unit 1220 may selectively irradiate light received from the light unit 1210 to the substrate 110. The DMD unit 1220 includes a light modulator. The light modulator transfers digital pattern information onto the substrate 110 in synchronization with a movement of the substrate 110 without a photomask. The DMD unit 1220 may include a digital micro-mirror device (DMD) 1222 as an example of the light modulator. The DMD 1222 selectively reflects light to the substrate 110 as an example of the light modulator.

Referring to FIG. 3, the DMD 1222 includes a plurality of unit mirrors. An angle of each unit mirror may be adjusted according to the pattern information. A direction in which light is reflected from the unit mirror is adjusted by changing an angle of each unit mirror. For example, the DMD 1222 may include a plurality of micro-mirrors 22b arranged in a lattice shape on a static RAM cell 22a. The micro-mirrors 22b included in one DMD 1222 may be arranged, for example, in a 1920×1080 matrix pattern. A high reflectance material, such as aluminum, may be deposited on a surface of the micro-mirror 22b.

When the pattern information is recorded in the cell 22a of the DMD 1222, an inclination angle of each micro-mirror 22b is determined according to the recorded pattern information. For example, the micro-mirror 22b may be inclined at 'a' degrees or '−a' degrees with respect to the surface of the substrate 110. 'a' may be about 12, but is not limited thereto. When the micro-mirror 22b is inclined at 'a' degrees may be also referred to as when the micro-mirror 22b is in an ON state, and when the micro-mirror 22b is inclined at '−a' degrees may be also referred to as when the micro-mirror 22b is in an OFF state. Alternatively, when the micro-mirror 22b is inclined at 'a' degrees may be also referred to as when the micro-mirror 22b is in an OFF state, and when the micro-mirror 22b is inclined at '−a' degrees may be also referred to as when the micro-mirror 22b is in an ON state. When the micro-mirror 22b is in the ON state, light incident to the DMD unit 1220 may be irradiated onto the substrate 110, and when the micro-mirror 22b is in the OFF state, light incident to the DMD unit 1220 may be stopped from being irradiated onto the substrate 110.

Referring back to FIG. 2, light transmitted from the light unit 1210 is reflected by the guide mirror 1221 included in the DMD unit 1220 to the DMD 1222, and the DMD 1222 may selectively reflect the light according to the pattern information input through each unit mirror.

Light reflected by the DMD 1222 may be converged or diverged while passing through a projection lens 1223 positioned under the DMD 1222. Light passing through the projection lens 1223 is irradiated onto the substrate 110.

The DMD unit 1220 may be connected to a pattern information transmission unit 1230. The pattern information transmission unit 1230 transmits information on a shape of a pattern to be formed on the substrate 110 to the DMD 1222. The information on the shape of the pattern to be formed may be simply referred to as "pattern information." The DMD 1222 may form the pattern on the substrate 110 by reflecting light to the substrate 110 in response to the pattern information input from the pattern information transmission unit 1230.

The exposure head 1200 may further include a DMD adjustment device 1240 for adjusting a position of the DMD 1222.

Figure 4:
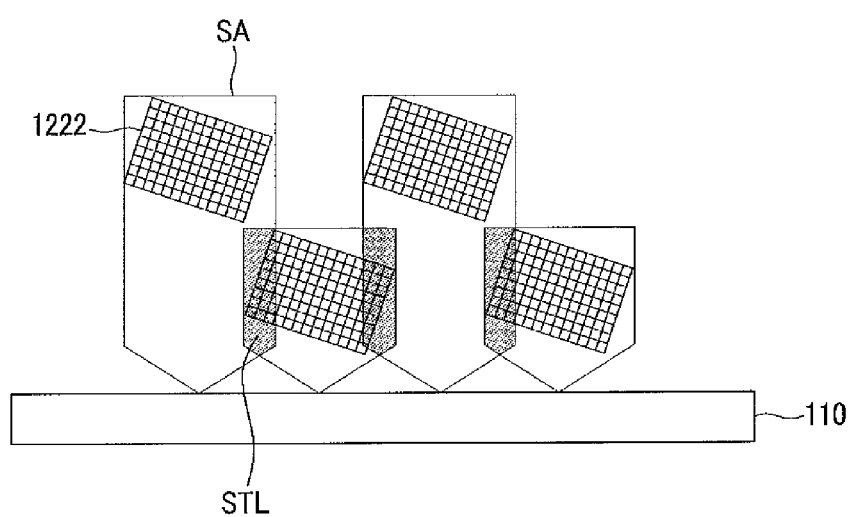
FIG. 4 is a cross-sectional view illustrating a method of exposing a substrate with a maskless exposure apparatus according to an exemplary embodiment of the present invention.
Figure 5:
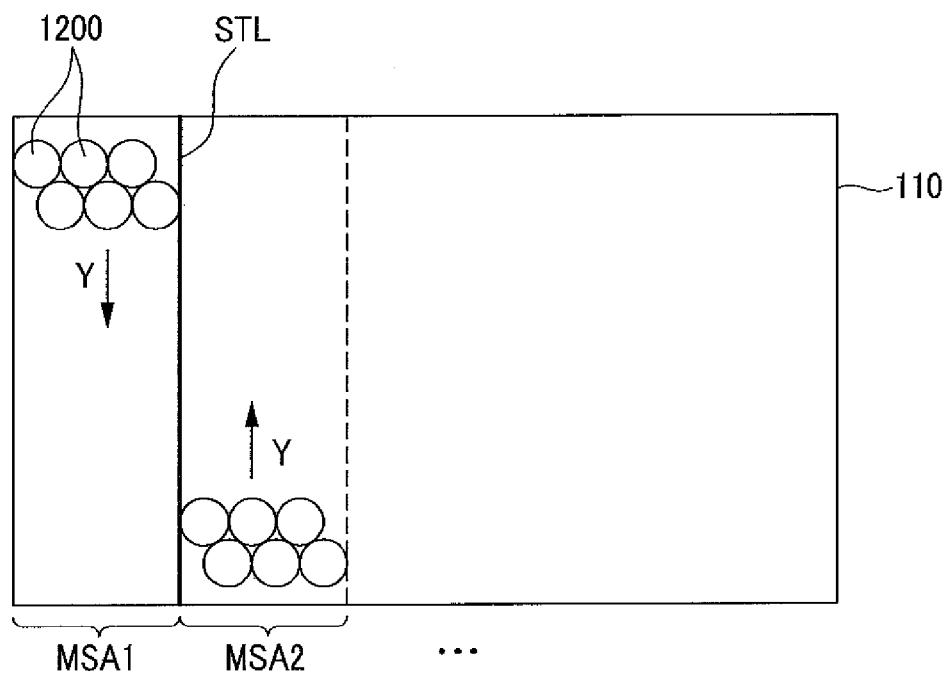
FIG. 5 is a top plan view illustrating a method of exposing and scanning a substrate with a maskless exposure apparatus according to an exemplary embodiment of the present invention.
Figure 6:
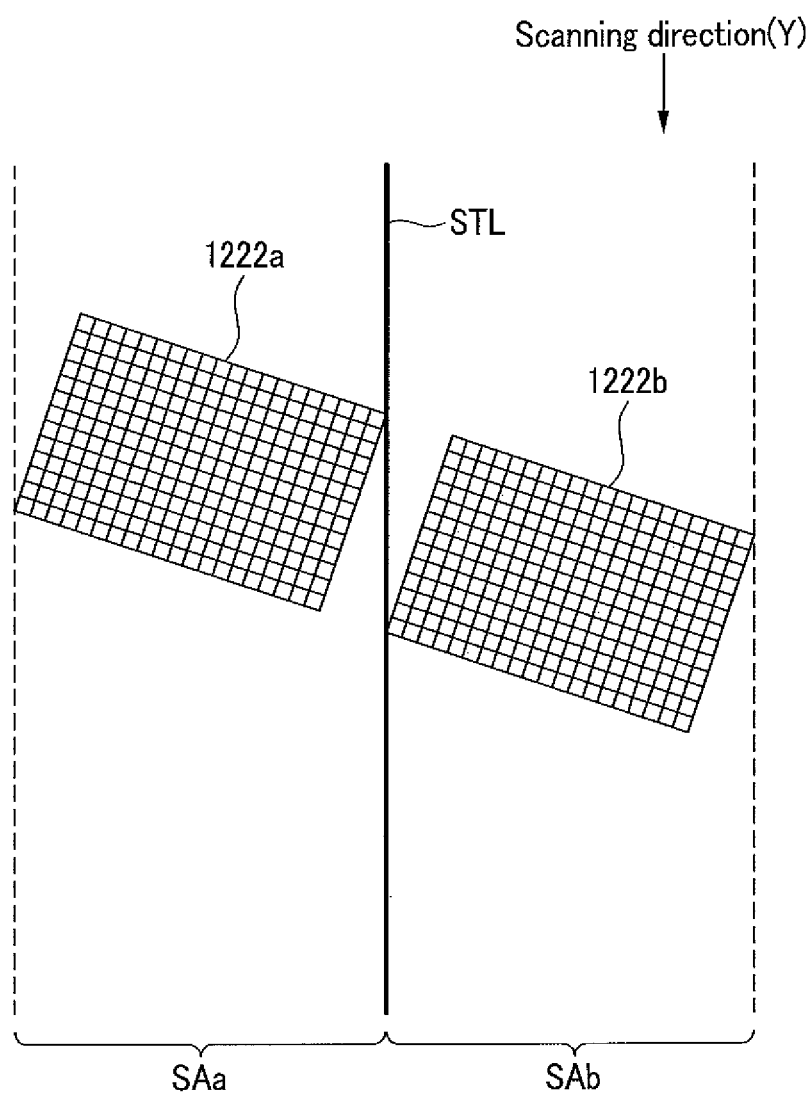
FIGS. 6 to 8 are views illustrating a method of performing exposure with a maskless exposure apparatus according to an exemplary embodiment of the present invention, respectively.
Figure 7:
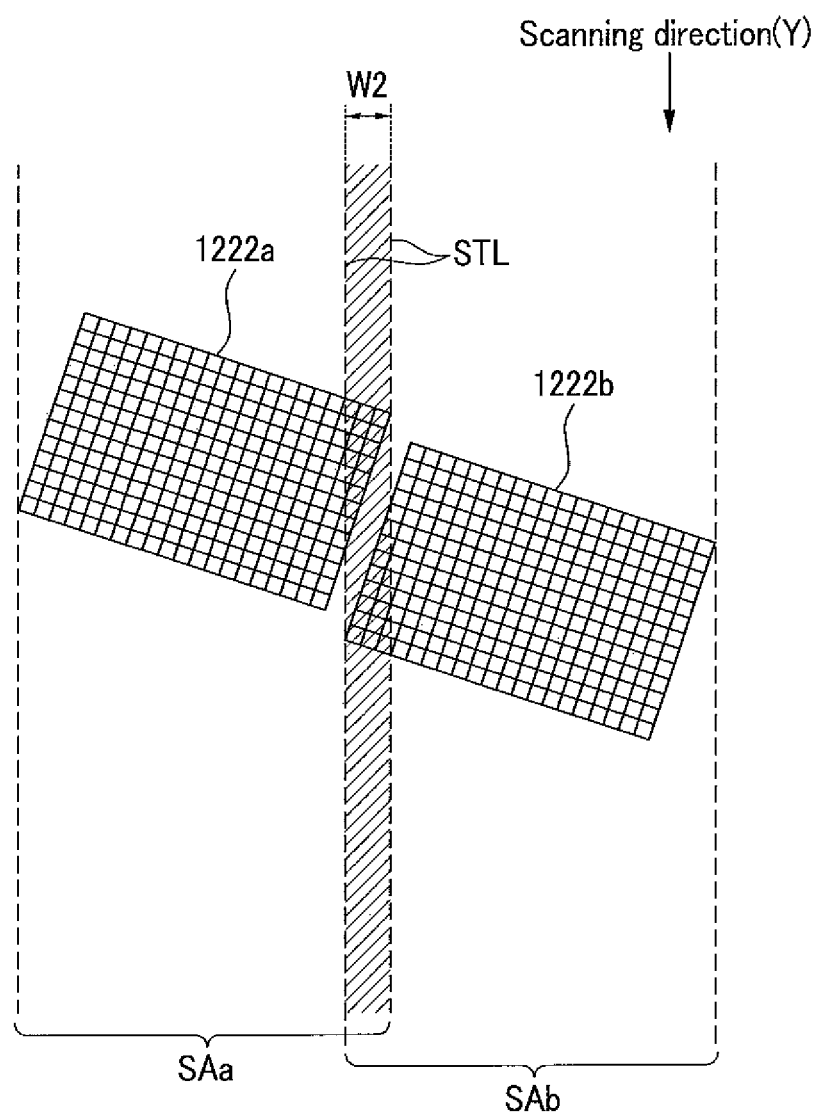
Figure 8:
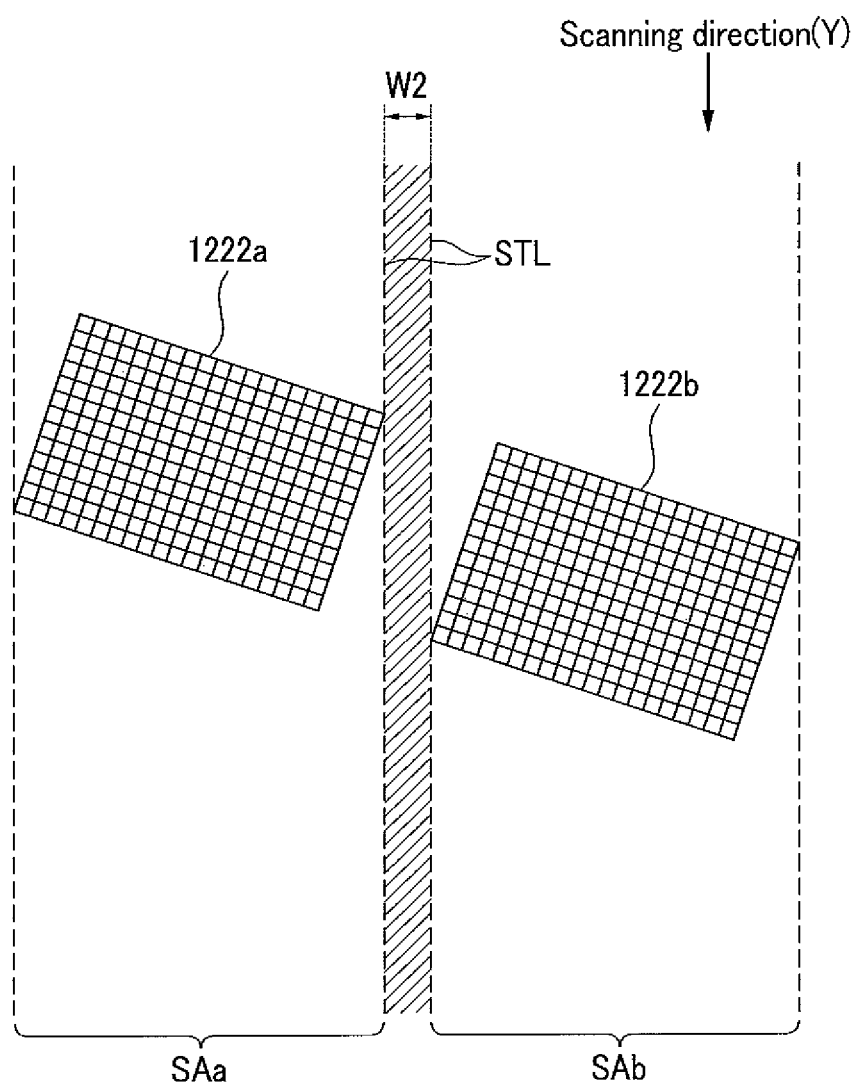

FIG. 4 is a cross-sectional view illustrating a method of exposing a substrate with a maskless exposure apparatus according to an exemplary embodiment of the present invention, FIG. 5 is a top plan view illustrating a method of exposing and scanning a substrate with a maskless exposure apparatus according to an exemplary embodiment of the present invention, and FIGS. 6 to 8 are views illustrating a method of performing exposure with a maskless exposure apparatus according to an exemplary embodiment of the present invention.

The substrate 110 is mounted on the stage 1100 of the maskless exposure apparatus according to an exemplary embodiment of the present invention. The substrate 110 may be, e.g., a large mother substrate for a display device. A tin film for forming a pattern and a photosensitive film, which is subject to exposure, may be applied on the substrate 110.

The substrate 110 is aligned.

An upper side of the substrate 110 is exposed to light while being moved by moving the stage 1100 back and forth in a Y-axis direction along the Y-directional driving guides 1500. The Y-axis direction is a scanning direction.

Referring to FIG. 4, the area of each DMD 1222 itself is not large enough to perform exposure on the relatively large substrate 110. Accordingly, the exposure apparatus 1000 may include a plurality of exposure heads 1200.

A boundary area between exposure regions SA of adjacent exposure heads 1200, in other words, a boundary area between exposure regions SA respectively corresponding to adjacent DMDs 1222 respectively included in the adjacent exposure heads 1200, is referred to as an exposure boundary region STL. The exposure boundary region STL may be extended in the scanning direction Y.

The exposure is performed by scanning the substrate 110 from one side of the substrate 110 to another side of the substrate 110 while moving the stage 1100 with respect to the exposure heads 1200. When the substrate 110 is large, the entire substrate 110 may be exposed to light by performing the scanning process several times. Referring to FIG. 5, a region of the substrate 110 exposed to light by performing scanning once is referred to as a scanning exposure region MSA1, MSA2, . . . .

Each scanning exposure region MSA1, MSA2, . . . includes at least one exposure region SA, and thus, an exposure boundary region STL is positioned at a boundary of adjacent scanning exposure regions, e.g., scanning exposure regions MSA1 and MSA2.

Referring to FIGS. 6 to 8, two exposure regions SA of adjacent exposure heads 1200 or two exposure regions SA adjacent to each other at a boundary between two scanning exposure regions adjacent to each other of the scanning exposure regions MSA1, MSA2, . . . include a first exposure region SAa and a second exposure region SAb. Further, the DMD 1222 of an exposure head 1200 irradiating light to the first exposure region SAa is referred to as a first DMD 1222a, and the DMD 1222 of an exposure head 1200 irradiating light to the second exposure region SAb is referred to as a second DMD 1222b.

Referring to FIG. 6, when an edge of the first exposure region SAa and an edge of the second exposure region SAb are consistent with each other, the exposure boundary region STL may be a boundary line between the edge of the first exposure region SAa and the edge of the second exposure region SAb. Thus, there may be substantially no overlapping region between the first exposure region SAa and the second exposure region SAb, or the distance between the first exposure region SAa and the second exposure region SAb may be substantially 0. In this case, all the micro-mirrors 22b included in the first DMD 1222a may be operated according to the pattern information, and all the micro-mirrors 22b included in the second DMD 1222b may also be operated according to the pattern information.

Referring to FIG. 7, the exposure boundary region STL may include an overlapping region between the first exposure region SAa and the second exposure region SAb as illustrated in FIG. 4. A width W2 of the exposure boundary region STL is determined by a width between the overlapping region of the first exposure region SAa and the second exposure region SAb. The ON/OFF states of the micro-mirrors 22b included in the first DMD 1222a of the first exposure region SAa and the micro-mirrors 22b included in the second DMD 1222b of the second exposure region SAb may be operated according to the pattern information, or the micro-mirrors 22b in the first and second DMDs 1222a and 1222b all may be in the OFF state.

Referring to FIG. 8, when the first exposure region SAa and the second exposure region SAb are spaced apart from each other, the exposure boundary region STL may be a space between the first and second exposure regions SAa and SAb. A width W2 of the exposure boundary region STL is larger than 0. All of the micro-mirrors 22b included in the first DMD 1222a and the micro-mirrors 22b included in the second DMD 1222b corresponding to the exposure boundary region STL may be operated according to the pattern information.

A pattern formed in an exposure boundary region STL between two adjacent exposure regions may be rendered to have the same or substantially the same quality as a pattern formed in the exposure regions other than the exposure boundary region STL by precisely adjusting the positions of the exposure heads 1200, and the position, size, and intensity of light reflected from each of the micro-mirrors 22b of the DMDs 1222 of the adjacent exposure heads 1200. However, the quality of light irradiated from the adjacent exposure heads 1200 is not always constant or uniform, and precisely adjusting the positions of the adjacent exposure heads 1200 is not easy. Accordingly, the quality of a pattern formed in the exposure boundary region STL may be different from the quality of a pattern formed in the exposure region other than the exposure boundary region STL.

Further, a difference in the quality between patterns respectively formed in the adjacent exposure regions SA with respect to the exposure boundary region STL may be noticeably large in the exposure boundary region STL.

Figure 9:
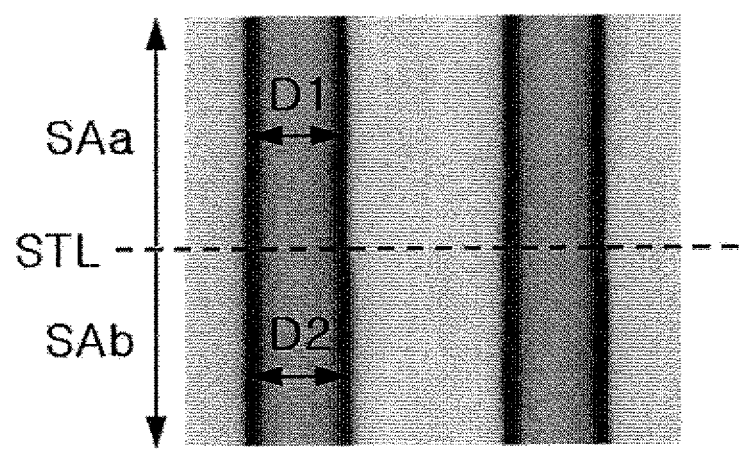
FIGS. 9 to 11 are photographs illustrating patterns formed by performing exposure with a maskless exposure apparatus according to an exemplary embodiment of the present invention, respectively.
Figure 10:
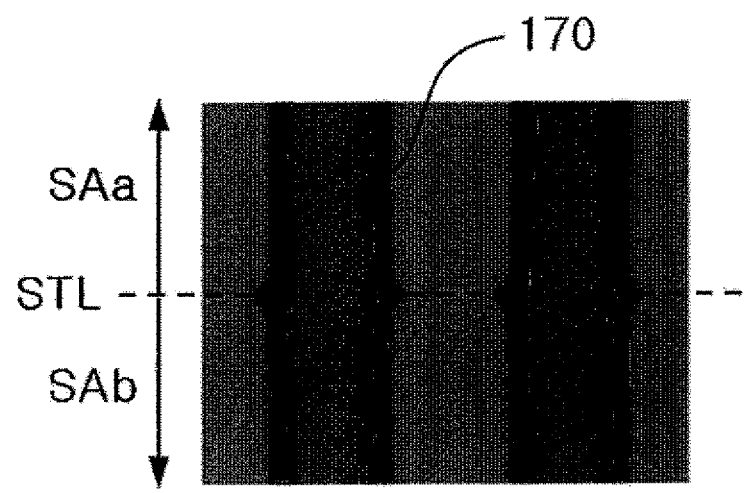
Figure 11:
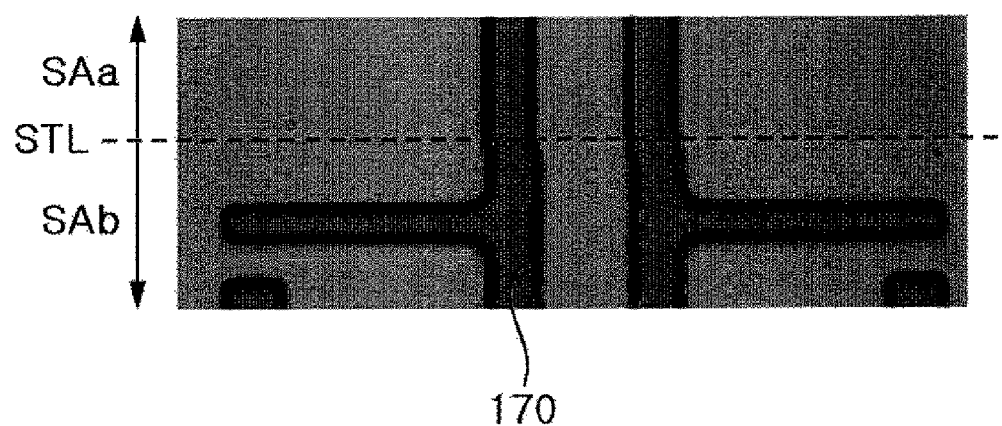

FIGS. 9 to 11 are photographs respectively illustrating patterns formed by performing exposure with a maskless exposure apparatus according to an exemplary embodiment of the present invention, respectively.

Two exposure regions SA of exposure heads 1200 adjacent to each other are respectively referred to as a first exposure region SAa and a second exposure region SAb. Two exposure regions SA adjacent to each other at the boundary between scanning exposure regions adjacent to each other among the scanning exposure regions MSA1, MSA2, . . . are also referred to as the first exposure region SAa and the second exposure region SAb, respectively.

In FIGS. 9 to 11, a scanning direction of the exposure heads 1200 is a horizontal direction.

Referring to FIG. 9, a width D1 of a pattern formed in the first exposure region SAa and a width D2 of a pattern formed in the second exposure region SAb may be different from each other with respect to the exposure boundary region STL.

Referring to FIG. 10, when a pattern fabricated by an exposure apparatus according to an exemplary embodiment of the present invention is signal wiring 170, a notch may be generated at the signal wiring 170 along the boundary between the first exposure region SAa and the second exposure region SAb, for example, at the exposure boundary region STL. The width of the signal wiring 170 may be uneven due to the notch. The width of the signal wiring 170 between the first and second exposure regions SAa and SAb may be different due to the notch from the width of the rest of the signal wiring 170 in the first exposure region SAa and/or the second exposure region SAb.

Referring to FIG. 11, when a pattern formed by an exposure apparatus according to an exemplary embodiment of the present invention is signal wiring 170, a portion of the signal wiring 170 in the first exposure region SAa and a portion of the signal wiring in the second exposure region SAb may be misaligned to each other with respect to the exposure boundary region STL.

When the quality of a pattern formed in an exposure region corresponding to the exposure boundary region STL is different from the quality of a pattern formed in the exposure region other than the exposure boundary region STL, a stain corresponding to the exposure boundary region STL may be viewed when the substrate 110 is used in the display device. The stain is also referred to as a stitch stain. Further, a portion of a pattern which is different in quality from the rest of the pattern formed in the exposure region other than the exposure boundary region STL, for example, a portion of the pattern formed in the exposure region corresponding to the exposure boundary region STL, is also referred to as a non-uniform pattern region.

Figure 12:
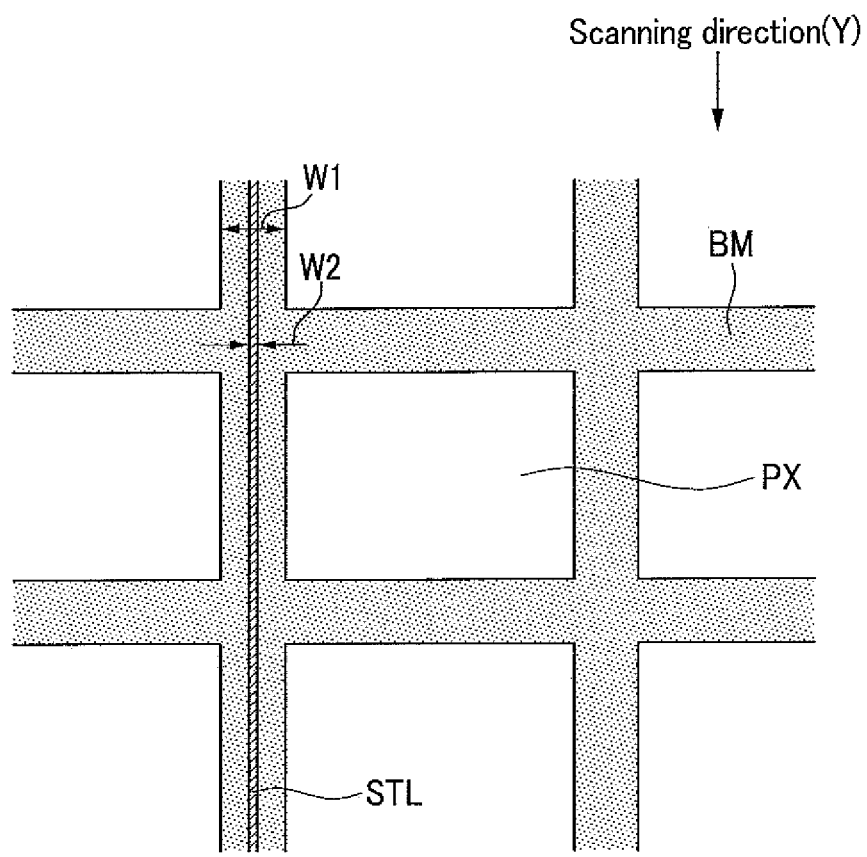
FIG. 12 is a top plan view illustrating a method of exposing a substrate for a display device with a maskless exposure apparatus according to an exemplary embodiment of the present invention.
Figure 13:
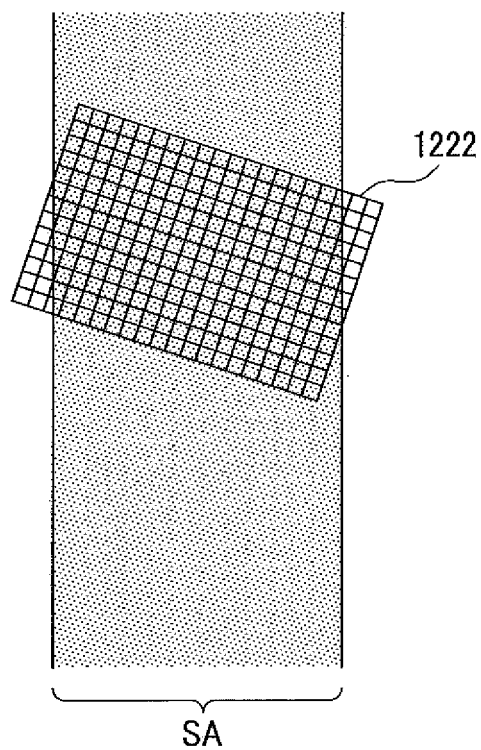
FIG. 13 is a view illustrating a method of performing exposure with a maskless exposure apparatus according to an exemplary embodiment of the present invention.

FIG. 12 is a top plan view illustrating a method of exposing a substrate for a display device with a maskless exposure apparatus according to an exemplary embodiment of the present invention, and FIG. 13 is a view illustrating a method of performing exposure with a maskless exposure apparatus according to an exemplary embodiment of the present invention.

Referring to FIG. 12, the display device according to an exemplary embodiment of the present invention includes a plurality of pixels PX for displaying an image. The plurality of pixels PX may be defined by openings of a light blocking region BM through which light is not transmitted. The light blocking region BM may be formed of an opaque thin film, such as a signal line, which blocks light transmission, or the light blocking region BM may be formed of a separate light blocking member.

When a thin film pattern is formed on the substrate 110 included in the display device by using a maskless exposure apparatus according to an exemplary embodiment of the present invention, an exposure process is performed so that the exposure boundary region STL may overlap the light blocking region BM. A width W2 of the exposure boundary region STL may be smaller than a width W1 of the light blocking region BM. Accordingly, a portion which may be viewed as a stitch stain in the fabricated display device is hidden by the light blocking region BM, and thus, the stitch stain is not actually viewed. Since the quality of a non-uniform pattern formable corresponding to the exposure boundary region STL is hidden by the light blocking region BM, the quality of the non-uniform pattern is not viewed by a viewer, and thus, the stitch stain is not viewed either. Further, a noticeable quality difference may be prevented from occurring between patterns formed in exposure regions SA adjacent to each other.

Referring to FIG. 13, for the exposure boundary region STL to overlap the light blocking region BM and to be hidden by the light blocking region BM when the first exposure region SAa and second exposure region SAb adjacent to each other overlap each other as shown in FIG. 7, the position of the exposure boundary region STL may be adjusted. Left and right positions of the exposure boundary region STL may be adjusted by adjusting ON/OFF of the micro-mirrors 22b of the DMDs 1222 included in the exposure heads 1200 for exposing the first exposure region SAa and the second exposure region SAb and by thus adjusting the exposure regions SA. For example, left and right edge positions of the exposure regions SA corresponding to the exposure heads 1200 may be adjusted by making at least one micro-mirror 22b positioned at a left or right edge portion among the plurality of micro-mirrors 22b of the DMD 1222 left in the OFF state.

Figure 14:
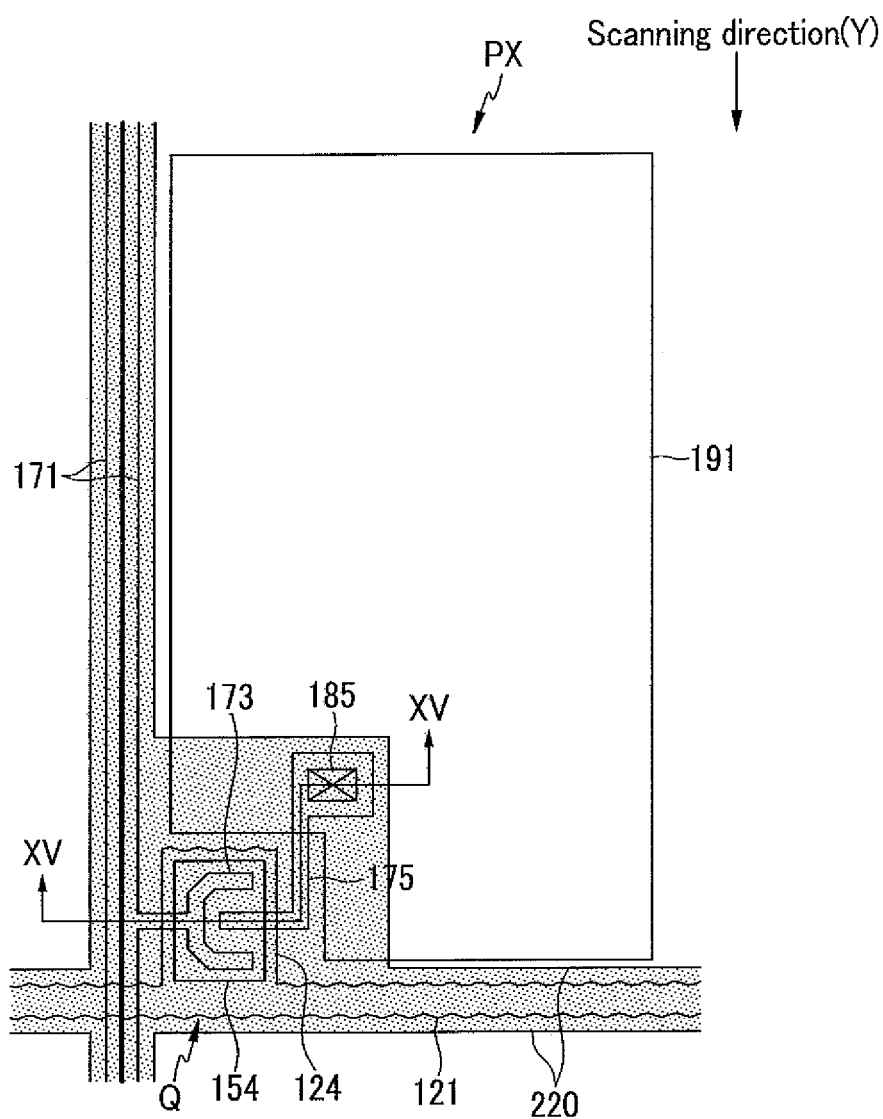
FIG. 14 is a layout view illustrating one pixel of a display device fabricated by performing exposure with a maskless exposure apparatus according to an exemplary embodiment of the present invention.
Figure 15:
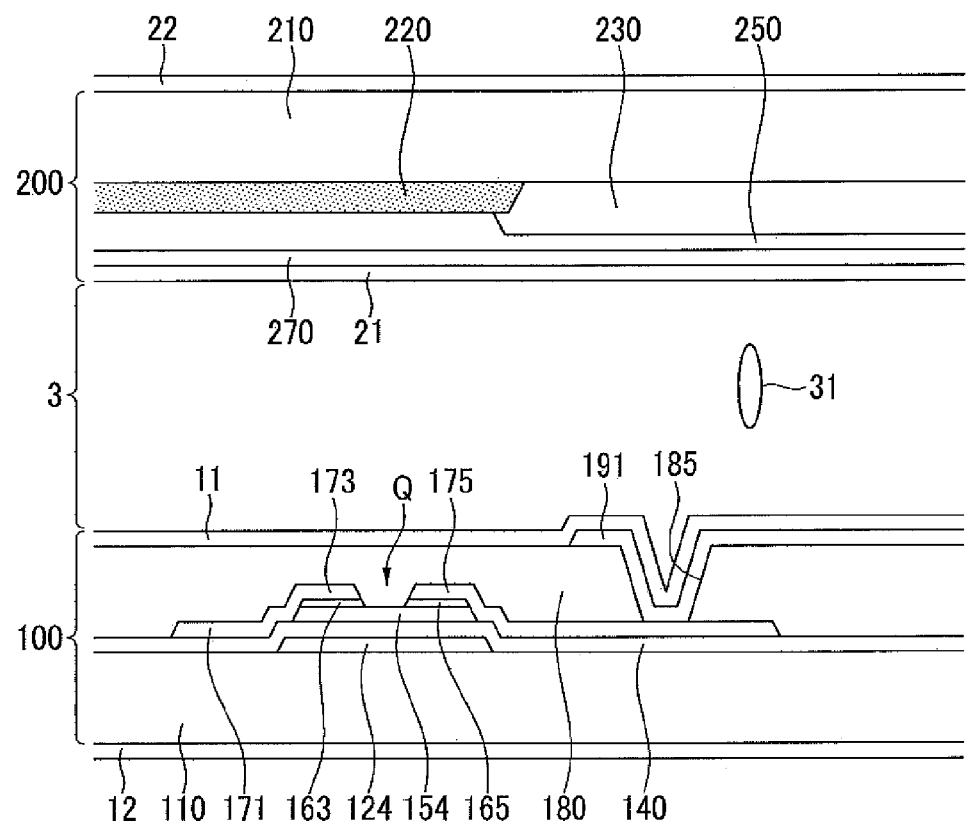
FIG. 15 is a cross-sectional view taken along line XV-XV of FIG. 14.

FIG. 14 is a layout view illustrating one pixel of a display device fabricated by performing exposure with a maskless exposure apparatus according to an exemplary embodiment of the present invention, and FIG. 15 is a cross-sectional view taken along line XV-XV of FIG. 14.

A liquid crystal display is described as an example according to an exemplary embodiment of the present invention. The liquid crystal display includes a lower display panel 100 and an upper display panel 200 facing each other and a liquid crystal layer 3 interposed between the two display panels 100 and 200.

A plurality of gate lines 121 including a gate electrode 124 is formed on a substrate 110. Through the gate line 121, a gate signal is transmitted.

A gate insulating layer 140 is formed on the gate lines 121, and a plurality of semiconductor layers 154 are formed of hydrogenated amorphous silicon, polysilicon, or an oxide semiconductor on the gate insulating layer 140.

A plurality of pairs of island-shaped ohmic contacts 163 and 165 is formed on the semiconductor layers 154. The island-shaped ohmic contacts 163 and 165 may be formed of a material, such as n+ hydrogenated amorphous silicon doped with a high-concentration n-type impurity, such as phosphorous, or may be formed of silicide.

A plurality of data lines 171 and a plurality of drain electrodes 175 are formed on the ohmic contacts 163 and 165 and the gate insulating layer 140. Through the data line 171 a data signal is transmitted. The data line 171 crosses the gate line 121. The data line 171 includes a source electrode 173 extending toward the gate electrode 124. The drain electrode 175 faces the source electrode 173.

The gate electrode 124, the source electrode 173, the drain electrode 175, and the semiconductor layer 154 configure a thin film transistor (TFT) Q.

A passivation layer 180 may be formed of an inorganic insulating material or an organic insulating material on the data line 171, the drain electrode 175, and an exposed portion of the semiconductor layer 154. A plurality of contact holes 185 through which the drain electrode 175 is exposed is formed in the passivation layer 180.

A plurality of pixel electrodes 191 may be formed of a transparent conductive material, such as indium tin oxide (ITO) or indium zinc oxide (IZO), or a reflective metal, such as aluminum, silver, chromium, or an alloy thereof, on the passivation layer 180. The pixel electrode 191 is connected with the drain electrode 175 through the contact hole 185 and receives a data voltage from the drain electrode 175. At least one pixel electrode 191 may be formed in one pixel PX.

A light blocking member 220 and a plurality of color filters 230 are formed on the substrate 210. The light blocking member 220 may prevent light leakage between pixels PX adjacent to each other. The light blocking member 220 may include a straight portion extending along the gate line 121 or the data line 171, and a surface-shaped portion hiding the thin film transistor Q. The color filters 230 are positioned at the openings of the light blocking member 220. The openings define transmission regions of the pixels PX. The light blocking member 220 may form a light blocking region BM.

An overcoat 250 may be formed on the color filter 230 and the light blocking member 220, and an electrode 270 facing the pixel electrode 191 may be formed on the overcoat 250 on an entire surface of the substrate.

At least one of the color filter 230, the light blocking member 220, and/or the opposed electrode 270 may be positioned on the lower display panel 100.

The liquid crystal layer 3 may include a liquid crystal molecule 31. The liquid crystal layer 3 may have dialectic anisotropy.

Alignment layers 11 and 21, respectively, are formed on internal surfaces of the two display panels 100 and 200.

Polarizers 12 and 22, respectively, may be attached to external surfaces of the two display panels 100 and 200.

The plurality of gate lines 121 including the gate electrode 124 is formed by stacking a conductive material layer including a metal on the substrate 110 and by then performing patterning on the stacked conductive material layer.

The plurality of semiconductor layers 154 is formed by stacking the gate insulating layer 140 on the gate lines 121, by stacking a layer including hydrogenated amorphous silicon, polysilicon, or an oxide semiconductor on the gate insulating layer 140, and by then performing patterning on the stacked layer.

The plurality of data lines 171 including the source electrode 173 and the plurality of drain electrodes 175 are formed by stacking a conductive material layer including, e.g. metal, on the semiconductor layer 154 and by performing patterning on the stacked layer. The island-shaped ohmic contacts 163 and 165 may be formed between the semiconductor layer 154 and the data lines 171 and between the semiconductor layer 154 and the drain electrodes 175.

The passivation layer 180 is formed by stacking an insulating material layer on the data lines 171, the drain electrodes 175, and the exposed portion of the semiconductor layer 154. The passivation layer 180 may be patterned to thus have the plurality of contact holes 185 which expose the drain electrodes 175.

The plurality of pixel electrodes 191 is formed by stacking a transparent conductive material layer including, e.g., ITO or IZO, or a reflective metal, such as aluminum, silver, chromium, and/or an alloy thereof, on the passivation layer 180, and by then performing patterning on the stacked layer.

A process of fabricating a display device according to an exemplary embodiment of the present invention includes performing a patterning process one or more times, and the patterning process may include the exposure method using a maskless exposure apparatus described above in connection with FIGS. 4 to 13. FIG. 14 illustrates an example in which scanning by the exposure head 1200 is performed in a direction substantially parallel to an extension direction of the data line 171.

As shown in FIG. 14, the exposure region SA of the exposure head 1200 may be adjusted so that the exposure boundary region STL that is a boundary between exposure regions adjacent to each other overlap the light blocking member 220. Accordingly, a stitch stain that may occur along the exposure boundary region STL is hidden by the light blocking region or the light blocking member 220, and thus, the stitch stain is not viewed from the outside.

As illustrated in FIG. 14, when a pattern extending in a direction substantially perpendicular to the scanning direction Y of the exposure head 1200, for example, the gate line 121, is exposed and patterned by using a maskless exposure apparatus according to an exemplary embodiment of the present invention, a rough portion may be formed at an edge side of the gate line 121.

While this invention has been particularly shown and described in connection with exemplary embodiments thereof, it is to be understood by those of ordinary skill in the art that various changes in form and details may be made therein without departing from the spirit and scope of the invention as defined by the appended claims.

What is claimed is:

1. A method of fabricating a display device, comprising:
    forming a first exposure region on a substrate by performing exposure while scanning the substrate with a first exposure head irradiating an exposure beam according to pattern information of a first pattern in a scanning direction; and
    forming a second exposure region adjacent to the first exposure region on the substrate by performing exposure while scanning the substrate with a second exposure head irradiating an exposure beam according to the pattern information of the first pattern in the scanning direction;
    wherein an exposure boundary region between the first exposure region and the second exposure region is extended in the scanning direction, and wherein
    the exposure boundary region overlaps a light blocking region.

2. The method of claim 1, wherein the first exposure head and the second exposure head scan the substrate substantially at the same time.

3. The method of claim 1, wherein the first exposure head and the second exposure head scan the substrate at different times from each other.

4. The method of claim 3, wherein the first exposure region and the second exposure region respectively belong to different scanning exposure regions from each other.

5. The method of claim 1, wherein an edge boundary of the first exposure region and an edge boundary of the second exposure region are substantially aligned with substantially the same line included in the exposure boundary region.

6. The method of claim 1, wherein the first exposure region and the second exposure region are spaced apart from each other and form a spaced region included in the exposure boundary region.

7. The method of claim 1, wherein the first exposure region and the second exposure region overlap each other and form an overlapping region included in the exposure boundary region.

8. The method of claim 1, wherein:
    at least one of the first exposure head or the second exposure head comprises a digital micro-mirror device (DMD) unit reflecting light from a light unit to the substrate, and wherein the DMD unit comprises a DMD selectively reflecting the light.

9. The method of claim 8, wherein the DMD comprises a plurality of micro-mirrors respectively adjusting inclined angles.

10. The method of claim 1, wherein a width of the light blocking region is equal to or larger than a width of the exposure boundary region.

11. The method of claim 1, wherein the light blocking region comprises a light blocking member.

12. A display device, comprising:
    a first pattern including a first portion and a second portion respectively positioned in a first region and a second region divided with respect to a boundary line extended in a first direction, the first pattern including a non-uniform pattern region formed along the boundary line; and
    a light blocking region overlapping the non-uniform pattern region,
    wherein a pattern quality of the non-uniform pattern region is different from a pattern quality of at least one of the first portion or the second portion.

13. The display device of claim 12, wherein a width of the first portion is different from a width of the second portion.

14. The display device of claim 12, wherein the non-uniform pattern region includes a notch having a width different from at least one of a width of the first portion or a width of the second portion.

15. The display device of claim 12, wherein the first portion and the second portion are misaligned with each other with respect to the boundary line.

16. The display device of claim 12, further comprising:
    a second pattern including a portion extending in a direction substantially perpendicular to the first direction; and
    a third pattern including a portion extending in a direction substantially parallel to the first direction,
    wherein the portion of the second pattern extending in the direction substantially perpendicular to the first direction is rougher than the portion of the third pattern extending in the direction substantially parallel to the first direction.

17. The display device of claim 12, wherein a width of the light blocking region is equal to or larger than a width of the non-uniform pattern region.

18. The display device of claim 12, wherein the light blocking region comprises a light blocking member.

19. A method of fabricating a display device, the method comprising:
    forming a first pattern on a first region of a substrate by performing an exposure process on the first region of the substrate by using a first exposure head;
    forming a second pattern on a second region of the substrate by performing the exposure process on the second region of the substrate by using a second exposure head; and
    forming a light blocking region on a boundary region between the first and second regions of the substrate.

20. The method of claim 19, wherein the boundary region is not recognized when viewed from an outside.

* * * * *